United States Patent [19]

Pastor et al.

[11] 4,429,009
[45] Jan. 31, 1984

[54] PROCESS FOR SURFACE CONVERSION OF VITREOUS SILICA TO CRISTOBALITE

[75] Inventors: Ricardo C. Pastor, Manhattan Beach; Luisa E. Gorre, Oxnard; Antonio C. Pastor, Santa Monica; Remedios K. Chew, Canoga Park, all of Calif.

[73] Assignee: Hughes Aircraft Company, El Segundo, Calif.

[21] Appl. No.: 315,597

[22] Filed: Oct. 30, 1981

[51] Int. Cl.³ ............................................. B32B 17/00
[52] U.S. Cl. .................................... 428/410; 65/30.1; 65/33; 427/93; 427/255; 428/446
[58] Field of Search .................. 427/93, 162, 255, 96, 427/255.3, 255.1, 255.4, 248.1, 399; 428/409, 446, 410; 65/30.1, 33

[56] References Cited

U.S. PATENT DOCUMENTS

| | | | |
|---|---|---|---|
| 3,047,438 | 7/1962 | Marinace | 427/93 |
| 3,692,571 | 9/1972 | Colton et al. | 427/93 |
| 3,772,134 | 11/1973 | Rau . | |
| 3,837,825 | 9/1974 | Loxley et al. . | |
| 4,261,753 | 4/1981 | Holcombe et al. . | |
| 4,279,654 | 7/1981 | Yajima et al. . | |
| 4,338,111 | 7/1982 | Edahiro et al. | 65/30.1 |

FOREIGN PATENT DOCUMENTS 686876 1/1951 United Kingdom ..................... 65/33

Primary Examiner—Sadie L. Childs
Attorney, Agent, or Firm—Mary E. Lachman; A. W. Karambelas

[57] ABSTRACT

The specification discloses a process for converting the surface layer of a body of vitreous silica to the more stable crystalline form of silica known as cristobalite. The surface of the body of vitreous silica is exposed to a gas phase reactive atmosphere comprising atomic iodine at a predetermined elevated temperature for a predetermined period of time to convert the surface layer of the vitreous silica to polycrystalline cristobalite and thus passivate and enhance the stability of the treated surface. The disclosed process is particularly useful for forming improved crucibles, such as those used in crystal growth from a melt.

7 Claims, 3 Drawing Figures

PROCESS FOR SURFACE CONVERSION OF VITREOUS SILICA TO CRISTOBALITE

BACKGROUND OF THE INVENTION

1. Field of the Invention

This invention relates generally to the field of silica materials and, more particularly, to a process for converting a vitreous silica surface to the more stable form of cristobalite.

2. Description of the Prior Art

Silica, or silicon dioxide ($SiO_2$), occurs abundantly in nature, comprising approximately 12 percent of all rocks, and exists in a variety of forms, both crystalline and amorphous. Silica is polymorphic (i.e. capable of existing in two or more crystalline forms), and the main forms of crystalline silica are quartz, tridymite, and cristobalite, which may be converted from one form to another at a given transition temperature. For example, quartz is converted to tridymite at 870° C., and tridymite is converted to $\beta$-cristobalite at 1470° C. In addition, each of these three main forms of silica exists in a low-temperature modification (the $\alpha$-form) and a high-temperature modification (the $\beta$-form), which transform from one to the other at a given temperature. Crystalline silica is useful for, among other things, forming optical elements and components.

Vitreous silica, on the other hand, is in the amorphous form, in which the solid is not crystallized, due to the irregular arrangement of the atoms in the solid. Vitreous silica is widely used for making chemical glassware, in which various chemical processes and reactions are conducted. In particular, vitreous silica is used as a crucible to contain a melt, such as molten gallium arsenide, silicon, or metal sulfides, during the crystal growth of these materials from the melt. However, such processes typically occur at elevated temperature (e.g. 1240° C. for gallium arsenide or 1410° C. for silicon), and the vitreous silica is soluble in the melt to some degree at these temperatures. Thus, the vitreous silica crucible can contaminate the crystal growth melt, and the crystal grown from this melt can become contaminated with silicon and/or oxygen. It is the alleviation of this prior art problem of the undesirable surface properties of vitreous silica at relatively high temperatures to which the present invention is directed.

SUMMARY OF THE INVENTION

In our earlier work described in copending patent application Ser. No. 294,581 filed Aug. 19, 1981 assigned to the present assignee, we discovered that a powder of vitreous silica can be converted to $\alpha$-cristobalite by treating the powder with a gas phase reactive atmosphere comprising atomic iodine at a selected elevated temperature for a predetermined period of time. The powder so treated was transformed to $\beta$-cristobalite, which, upon cooling, transformed further to $\alpha$-cristobalite. The treated powder was then melted and cooled to the vitreous state, forming fused cristobalite, the solid form having a melting point in excess of 1800° C.

In accordance with the present invention, we have further discovered that the surface layer of a body of vitreous silica may be converted to polycrystalline cristobalite by treating the vitreous silica surface with the atomic iodine gas phase reactive atmosphere as described above in relation to patent application Ser. No. 295,581.

The general purpose of the present invention is to provide a new and improved process for the conversion of a surface layer of vitreous silica to cristobalite, to thereby increase the stability of this surface layer.

The above-described general purpose is accomplished by exposing the surface of a substrate of vitreous silica to a gas phase reactive atmosphere comprising atomic iodine at a predetermined elevated temperature for a predetermined period of time. The surface layer of the vitreous silica substrate is thus converted to $\beta$-cristobalite. Upon cooling, the latter transforms to $\alpha$-cristobalite, which passivates and enhances the stability of the treated surface.

Accordingly, it is a further purpose of the present invention to provide a new and improved process for transforming the surface of a vitreous silica substrate to the more stable crystalline form of cristobalite.

Another purpose is to provide a new and improved process for passivating the surface of an article formed of vitreous silica.

Still another purpose is to provide a new and improved vitreous silica article having a surface passivation layer of cristobalite with increased thermal stability.

A feature of the present invention is that it may be carried out using controlled reactive atmosphere processing.

The foregoing and other features and advantages of the present invention will become apparent from the following more particular description of the preferred embodiments of the invention, as illustrated in the accompanying drawings.

DETAILED DESCRIPTION OF THE INVENTION

Figure 1:
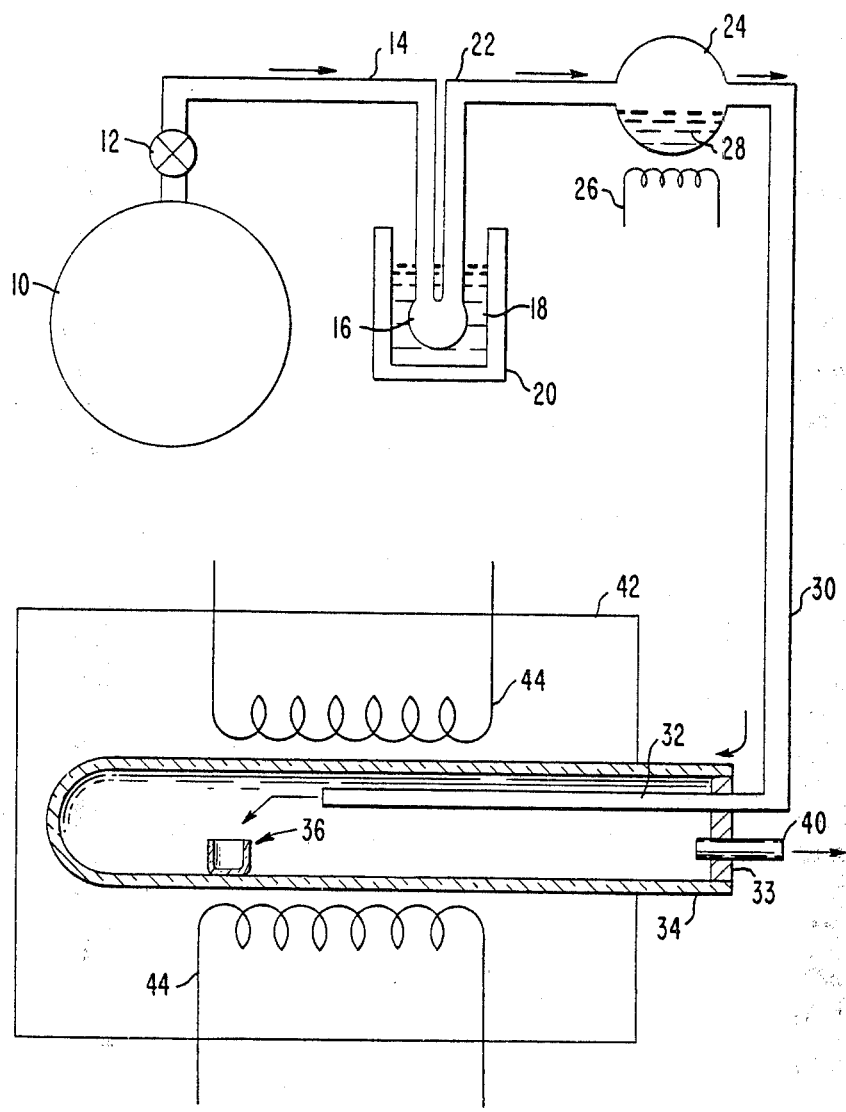
FIG. 1 illustrates, in schematic form, an apparatus suitable for carrying out one process embodiment of the present invention.

In FIG. 1 there is shown, in schematic form, an apparatus suitable for carrying out one process embodiment of the present invention. High purity oxygen (99.99% pure) is provided in a container 10 which is connected to a valve 12, which is connected at its other end to the quartz or pyrex tubing 14. The tubing 14 is connected to a water trap device 16 that is immersed in a mixture of dry ice and acetone 18 in the container 20. The quartz or pyrex tubing 22 which emerges as shown from the exit of the water trap device 16, leads to a quartz or pyrex container 24 which holds iodine ($I_2$) initially in solid form. Upon activation of the heating element 26 which is located near the bottom of the container 24, the solid iodine forms the liquid 28 and is then vaporized. Optionally, the temperature in the container 24 may be controlled to produce sufficient vapor pressure directly from the solid iodine. The iodine vapor mixed with the dried oxygen gas in the container 24 passes through the Teflon tube 30 to a connecting high purity (99.9%) alumina tube 32 which passes through a Teflon or vitreous silica cap 33 and then into a high purity alumina reaction tube 34.

Within the reaction tube 34, there is placed the vitreous silica crucible 36 to be treated. The reaction tube 34 also has a high purity alumina tube 40 through which exhaust gases are removed from the reaction tube 34. The reaction tube 34 is contained within a furnace 42 which has heating elements 44 that can be controlled to raise the temperature in the furnace 42 to a predetermined level at which atomic oxygen and atomic iodine are formed from the molecular oxygen and iodine mixture. The method of use of the apparatus shown in FIG. 1 is described below.

Figure 2:
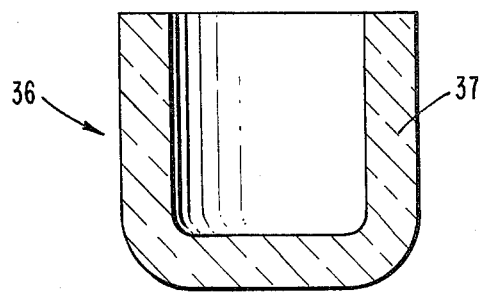
FIG. 2 illustrates, in schematic cross-section, a vitreous silica crucible prior to treatment in accordance with the process of the present invention.

In FIG. 2, there is shown, in schematic form, a commercially available crucible 36 (such as from Thermal American Fused Quartz Company of Montville, N.J. or from Heraeus Amersil Inc. of Sayreville, N.J.) comprising a body 37 of vitreous silica, and as is commonly used to contain the melt for the growth of crystals of gallium arsenide or silicon from a melt. In accordance with the present invention, the vitreous silica crucible 36 is exposed to an atmosphere comprising atomic iodine at a predetermined elevated temperature for a predetermined period of time. The apparatus illustrated in FIG. 1 and described above is used as described herein to generate a reactive atmosphere comprising a mixture of atomic oxygen and atomic iodine. Alternatively, the process of the present invention may be accomplished using the apparatus shown in FIG. 1 and a reactive atmosphere comprising a vapor mixture of iodine with an inert carrier gas, such as helium, from which atomic iodine is formed as described above. In the latter case, the oxygen described in relation to FIG. 1 is replaced by the carrier gas. If the carrier gas is provided at a high purity, such as 99.999 percent pure helium, the water trap device 16 and associated coolant 18 and container 20 are not needed to remove water from the carrier gas.

The vitreous silica crucible 36 to be treated is placed in the alumina reaction tube 34 of the apparatus shown in FIG. 1 and the reaction tube is sealed. A gas mixture comprising approximately 3 percent iodine in dry oxygen is formed by flowing high purity, low-humidity oxygen gas at a rate of 1 cubic centimeter per second over iodine crystals in the pyrex container 24. The container 24 is maintained at 86° to 90° C., where the vapor pressure of solid iodine is approximately 22 to 25 millimeters of mercury.

The iodine/oxygen gas mixture so formed is passed into the alumina reaction tube 34 and is brought into contact with the vitreous silica crucible 36 contained in the reaction tube. The reaction tube 34 is maintained at a temperature of 1200° C. to 1400° C. for a predetermined period of time, for example, 24 hours. At the elevated temperature in the reaction tube, atomic iodine and atomic oxygen are formed from the gas mixture of molecular oxygen and iodine. The gas phase reactive atmosphere comprising atomic iodine and atomic oxygen reacts with the surface of the body 37 of vitreous silica comprising the crucible 36 and converts this surface to β-cristobalite in polycrystalline form. Upon cooling to a temperature below 230° to 260° C., the β-cristobalite transforms to α-cristobalite.

Figure 3:
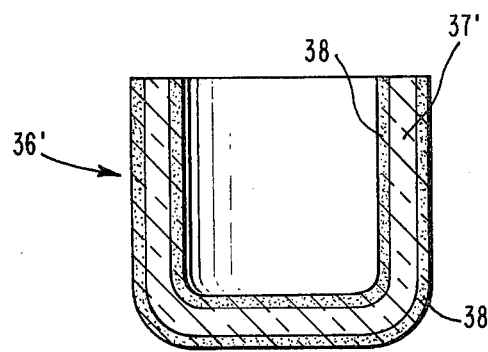
FIG. 3 illustrates, in schematic cross-section, a vitreous silica crucible having a surface passivation layer of cristobalite, formed in accordance with the process of the present invention.

The crucible 36' so formed is shown in schematic cross-section in FIG. 3 and comprises a body 37' of vitreous silica having slightly reduced dimensions as compared to the body 37 of vitreous silica shown in FIG. 2 and having a layer 38 of α-cristobalite formed on the exposed surfaces thereof. The layer 38 was determined to be of uniform thickness and uniform crystal grain size. A portion of the layer 38 of α-cristobalite was chipped off from the vitreous silica body 37' and the former was identified by x-ray diffraction analysis to be α-cristobalite, in accordance with known procedures as described for example, by Harold P. Klug and Leroy E. Alexander in the book entitled "X-ray Diffraction Procedures for Polycrystalline and Amorphous Materials", John Wiley and Sons, July 1962. It should be noted that the transformation of β-cristobalite to α-cristobalite is reversible at a temperature in the range of 230° to 260° C. Consequently, when the crucible formed by the process of the present invention is used to contain a crystal growth melt a elevated temperatures, such as 1240° C., the α-cristobalite layer 38 shown in FIG. 3 transforms to β-cristobalite.

The thickness of the layer 38 of α-cristobalite shown in FIG. 3 depends on the length of the exposure time of the vitreous silica crucible to the reactive atmosphere, with the layer 38 being thicker for longer exposure times. The exposure time, in turn, depends on the temperature in the reaction chamber, with longer exposure times being required for lower temperatures. At a reaction chamber temperature of approximately 1400° C. with an exposure time of 24 hours, a layer of cristobalite having a thickness of approximately 400 micrometers is formed. At a temperature of 1200° C., with an exposure time of 24 hours, a layer of cristobalite several micrometers thick is formed. Since a layer of cristobalite several micrometers thick is ample to passivate the vitreous silica surface, it should be sufficient to treat the vitreous silica crucible in accordance with the present invention at 1400° C. for a few hours or at a lower temperature for a longer period of time. Because of the difference in properties between the polycrystalline layer and the vitreous substrate, there is a limit to the thickness of the cristobalite layer that may remain adherent to the substrate. Thicknesses of several hundred micrometers have a tendency to flake off the substrate upon cooling. As a practical matter in order to form an adherent layer, the thickness of the cristobalite layer is preferably less than 100 micrometers for the purposes described herein, and may be as low as 2 to 3 micrometers.

It is believed that the mechanism for the conversion of vitreous silica to α-cristobalite in accordance with the present invention is a three-step process. First, the atomic iodine, mixed with atomic oxygen or helium, reacts with and removes water and water-derived impurities (i.e., hydrogen and hydroxyl ions) from the surface layer of vitreous silica. These hydrogen and hydroxyl ion impurities are produced by the reaction of water impurities with the oxide (i.e., silica) to produce free-hydroxyl groups or hydrogen-bond species, both of which must be removed in the form of hydroxyl ions. In accordance with the present invention, the atomic iodine displaces the hydroxyl ion, as shown in Equation (1) below.

$$I + OH^- \rightarrow I^- + OH \qquad (1)$$

The free hydroxyl species so formed diffuses through the oxide crystal, volatilizes as an unreacted species or as the reacted species IOH, and is removed from the crystal.

Then, the vitreous silica freed of water impurities and held at elevated temperature, such as 1200° to 1400° C., undergoes a rearrangement of atoms to form the crystalline structure of silica known as $\beta$-cristobalite. This $\beta$-cristobalite is formed as polycrystals, rathwer than as a single crystal. Finally, upon cooling below 230° to 260° C., the $\beta$-cristobalite layer converts to $\alpha$-cristobalite. The thermal instability of $\alpha$-cristobalite and its conversion to $\beta$-cristobalite at 230° to 260° C. is discussed by H. Remy in the book entitled "Treatise on Inorganic Chemistry", Vol. I, Elsevier, 1956, at page 12. Thus, a cristobalite layer is formed in accordance with the present invention by surface-layer transformation of the vitreous silica, providing an adherent and uniform layer on the surface of the vitreous silica.

As discussed in detail in copending patent application Ser. No. 294,581, the $\alpha$-cristobalite formed by treatment of vitreous silica with a reactive atmosphere comprising atomic iodine has greater thermal stability then naturally occurring $\alpha$-cristobalite. In particular, the $\alpha$-cristobalite formed by the process of patent application Ser. No. 294,581, has a higher transition temperature for conversion to the $\beta$-form. In addition, the melting point of the solid cristobalite product of the latter invention is in excess of 1800° C., as compared to 1705° C. for naturally occurring $\beta$-cristobalite, as reported by Remy, referenced above. These results disclosed in patent application Ser. No. 294,581 indicate that the $\alpha$ and $\beta$ forms of cristobalite formed by the disclosed reactive atmosphere processing have a lower free energy than their conventional counterparts.

Likewise, the layer of cristobalite formed on the body of vitreous silica as described herein provides a more stable material with a lower free energy than either vitreous silica or cristobalite known heretofore. Consequently, the cristobalite of the present invention is less soluble than vitreous silica in a melt, such as gallium arsenide or silicon, contained in the crucible and, thus, produces less contamination of the melt and the crystal grown therefrom. In addition, this cristobalite layer is free from hydroxyl impurities which are readily leached out by the melt and produce contamination of the melt.

Moreover, this cristobalite layer presents a more nonwetting surface with respect to the melt, which saves the crucible from cracking when the melt solidifies. Finally, the cristobalite formed by the process of the present invention has a higher melting point (i.e. greater than 1800° C.) than vitreous silica (approximately 1500° C.) and provides a harder, more refractory material that is a more suitable surface to interface with molten material at high temperatures. In summary, a layer of cristobalite formed on the surface of a body of vitreous silica in accordance with the present invention passivates (i.e. reduces the reactivity of) this surface and improves the stability of this surface. In turn, the crystals grown from a melt contained in such a passivated silica crucible will have improved purity as compared to crystals grown from a melt in a vitreous silica crucible.

Moreover, the use of reactive atmosphere processing in accordance with the present invention is further conducive to maintaining the purity of the melt contained in the crucible. As discussed herein and in copending patent application Ser. No. 294,581, treatment of vitreous silica with a reactive atmosphere comprising atomic iodine removes water and water-derived impurities from the silica. The material so treated is free from hydroxyl ions and is thus free from the prior art problem of the hydroxyl ion attraction for a metal melt contained in a crucible of this material, which causes the metal melt to cling to the walls of the crucible, thereby causing the crucible to crack when the melt solidifies. In addition, the atomic iodine used in the reactive atmosphere processing described herein reacts with metal ion impurities in the silica, converting them to iodides which can be volatilized and removed from the silica. Thus, incorporation of metal ion impurities into the melt contained in a crucible of the material formed by the process of the present invention is prevented.

While the present invention has been particularly described with respect to the preferred embodiments thereof, it will be recognized by those skilled in the art that certain modifications in form and detail may be made without departing from the spirit and scope of this invention. In particular, the present invention is not limited to the treatment of a vitreous silica crucible, which was used merely as an example, but is intended to include the treatment of any body or substrate of vitreous silica in accordance with the process described herein, in order to passivate and stabilize the surface of the vitreous silica. In particular, the process of the present invention may be used to provide a layer of improved silica material in semiconductor and electro-optical devices and circuits formed by thin film technology. In addition, it is not intended to limit the present invention to the particular process described herein for forming a gas phase reactive atmosphere comprising atomic iodine, but to include other known processes for forming atomic iodine.

What is claimed is:

1. A process for forming a uniform, adherent, polycrystalline layer of cristobalite on the surface of a vitreous silica substrate comprising the steps of:
   (a) providing said substrate of vitreous silica; and
   (b) exposing said surface of said substrate to a gas phase reactive atmosphere comprising atomic iodine at a predetermined elevated temperature for a predetermined period of time to thereby enable said atomic iodine to react with and remove water and water-derived impurities from the surface layer of said vitreous silica and to subsequently convert said surface layer of said vitreous silica to crystalline $\beta$-cristobalite having a melting point in excess of 1800° C.

2. The process set forth in claim 1 which further comprises the step of cooling said substrate after said exposing of step "b", to transform said $\beta$-cristobalite to $\alpha$-cristobalite.

3. The process set forth in claim 1 wherein said gas phase reactive atmosphere is selected from the group consisting of a vapor mixture of iodine and oxygen, and a vapor mixture of iodine and an inert carrier gas.

4. The process set forth in claim 3 wherein:
   (a) said gas phase reactive atmosphere comprises approximately 3 percent iodine in dry oxygen;
   (b) said predetermined elevated temperature is within the range of 1200° to 1400° C.; and
   (c) said predetermined period of time is approximately 24 hours.

5. A process for passivating the surface of an article of vitreous silica comprising exposing said article to a gas phase reactive atmosphere comprising atomic iodine at a predetermined elevated temperature for a predetermined period of time to remove water-derived impurities from the surface layer of said vitreous silica and subsequently transform said surface layer of said vitreous silica to polycrystalline cristobalite having a melting point in excess of 1800° C., and to thereby provide passivation and enhanced stability of said surface of said article.

6. An article of manufacture comprising a body of vitreous silica having a uniform, adherent layer of polycrystalline cristobalite of predetermined thickness formed on the surface of said body of said vitreous silica, characterized in that said cristobalite has a melting point in excess of 1800° C.

7. The article set forth in claim 6 wherein said predetermined thickness is within the range of 2 to 100 micrometers.

* * * * *